United States Patent
Shih

(10) Patent No.: US 8,101,987 B2
(45) Date of Patent: Jan. 24, 2012

(54) SEMICONDUCTOR DEVICE AND METHOD OF FABRICATING THE SAME

(75) Inventor: Hui-Shen Shih, Chang-Hua Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 47 days.

(21) Appl. No.: 12/846,832

(22) Filed: Jul. 30, 2010

(65) Prior Publication Data

US 2010/0289066 A1 Nov. 18, 2010

Related U.S. Application Data

(62) Division of application No. 12/132,106, filed on Jun. 3, 2008, now Pat. No. 7,795,056.

(51) Int. Cl.
*H01L 23/02* (2006.01)

(52) U.S. Cl. ............ 257/313; 257/393; 257/E21.637; 257/E23.111; 257/E27.026; 257/E29.114

(58) Field of Classification Search .......... 257/313–316, 257/393, 529–530, E21.637, 23.111, 27.026, 257/29.004, 119, 295
See application file for complete search history.

(56) References Cited

U.S. PATENT DOCUMENTS

| | | | |
|---|---|---|---|
| 5,416,355 A * | 5/1995 | Kudoh | 257/529 |
| 6,239,034 B1 | 5/2001 | Yang | |
| 6,583,012 B1 * | 6/2003 | Buynoski et al. | 438/275 |
| 6,657,832 B2 | 12/2003 | Williams | |
| 6,822,304 B1 | 11/2004 | Honer | |
| 6,943,448 B2 | 9/2005 | Gabriel | |
| 7,061,073 B2 * | 6/2006 | Dahl et al. | 257/532 |
| 7,202,101 B2 | 4/2007 | Gabriel | |
| 7,265,477 B2 | 9/2007 | Wan | |
| 7,312,110 B2 * | 12/2007 | Kwak et al. | 438/150 |
| 7,329,933 B2 | 2/2008 | Zhe | |
| 7,420,728 B2 | 9/2008 | Tung | |
| 7,550,756 B2 * | 6/2009 | Asano et al. | 257/3 |
| 7,642,110 B2 | 1/2010 | Miles | |
| 7,704,772 B2 | 4/2010 | Tung | |
| 2010/0065930 A1 | 3/2010 | Nakatani | |

* cited by examiner

*Primary Examiner* — Michael S Lebentritt
(74) *Attorney, Agent, or Firm* — Winston Hsu; Scott Margo

(57) ABSTRACT

A semiconductor device is disclosed. The semiconductor device includes: a first electrode, disposed over a first region of a substrate; and a conductive layer, disposed over the substrate, including a second electrode disposed above the first electrode, wherein the second electrode comprises a mesh main part having a plurality of openings, and a plurality of extending parts, wherein the extending parts are connected to the mesh main part at periphery of the openings and extend toward a surface of the first electrode.

6 Claims, 9 Drawing Sheets

SEMICONDUCTOR DEVICE AND METHOD OF FABRICATING THE SAME

CROSS REFERENCE TO RELATED APPLICATIONS

This application is a division of U.S. application Ser. No. 12/132,106 filed Jun. 3, 2008, and incorporated herein by reference in its entirety.

BACKGROUND OF THE INVENTION

1. Field of the Invention

The present invention relates to a semiconductor device and a method of fabricating the same. More particularly, the present invention relates to a microelectromechanical system (MEMS) device and a method of fabricating the same.

2. Description of the Prior Art

A microelectromechanical system (MEMS) refers to micro electromechanical devices fabricated within a miniaturized packaging structure, and such devices are also referred to as MEMS devices. The MEMS devices include tiny electromechanical devices such as an accelerometer, switches, capacitors, sensors and a microphone, etc. The MEMS devices fabricated based on the MEMS technique have a plurality advantages. For example, an MEMS microphone fabricated based on the MEMS technique has features of light-weight, small-size and excellent signal quality, etc. Therefore, the MEMS microphones become popular in the market. Moreover, with a general trend of lightness, slimness, shortness and smallness for the electronic devices, demand of the MEMS devices is gradually improved. Therefore, the MEMS technique is required to be further developed to cope with the demands of the market.

SUMMARY OF THE INVENTION

The present invention is directed to a method of fabricating a semiconductor device, by which MEMS devices may be integrated with a complementary metal-oxide-semiconductor (CMOS) process.

The present invention is directed to a semiconductor device including an electrode with a mesh main part and extending parts.

The present invention provides a method of fabricating a semiconductor device. First, a first electrode is formed over a first region of a substrate. Next, a dielectric layer covering the first electrode is formed over the substrate. A plurality of openings is formed in the dielectric layer on the first region. Thereafter, a conductive layer covering the dielectric layer and the openings is formed over the substrate. Next, the conductive layer at the bottoms of the openings over the first region is removed to form second electrodes. Finally, the dielectric layer between the second electrode and the first electrode is removed.

According to an embodiment of the present invention, the method of removing the conductive layer at the bottoms of the openings over the first region includes etch-back process.

According to an embodiment of the present invention, the method of removing the conductive layer at the bottoms of the openings over the first region includes following steps. First, a mask layer is formed over the substrate, wherein the mask layer covers the conductive layer between the openings over the first region and exposes the conductive layer at the bottoms of the openings over the first region. Next, the conductive layer at the bottoms of the openings over the first region is removed while using the mask layer as a mask. Finally, the mask layer is removed.

According to an embodiment of the present invention, the first region includes a MEMS device region.

According to an embodiment of the present invention, the semiconductor device includes an MEMS microphone.

According to an embodiment of the present invention, the substrate further includes a second region.

According to an embodiment of the present invention, the second region includes a CMOS region, and the conductive layer extends to the CMOS region, wherein before the step of removing the conductive layer at the bottoms of the openings over the first region, the conductive layer on the CMOS region is further patterned.

According to an embodiment of the present invention, the method of patterning the conductive layer on the CMOS includes the following steps. First, a first mask layer is formed over the substrate, wherein the first mask layer covers the first region and exposes a part of the conductive layer on the CMOS region. Next, the part of the conductive layer on the CMOS region is removed while using the first mask layer as a mask. Finally, the first mask layer is removed.

According to an embodiment of the present invention, the method of removing the conductive layer at the bottoms of the openings over the first region includes the following steps. First, a second mask layer is formed over the substrate, wherein the second mask layer covers the CMOS region and exposes the conductive layer on the first region. Next, the conductive layer at the bottoms of the openings over the first region is removed while using the second mask layer as a mask. Finally, the second mask layer is removed.

According to an embodiment of the present invention, the method of removing the conductive layer at the bottoms of the openings over the first region includes etch-back process.

According to an embodiment of the present invention, the method of removing the conductive layer at the bottoms of the openings over the first region includes following steps. First, a second mask layer is formed over the substrate, wherein the second mask layer covers the conductive layer on the CMOS region and the conductive layer between the openings over the first region, and exposes the conductive layer at the bottoms of the openings over the first region. Next, the conductive layer at the bottoms of the openings over the first region is removed while using the second mask layer as a mask. Finally, the second mask layer is removed.

According to an embodiment of the present invention, the second region includes a CMOS region, and the conductive layer extends to the CMOS region, wherein during the step of removing the conductive layer at the bottoms of the openings over the first region, the conductive layer on the CMOS region is further simultaneously patterned.

According to an embodiment of the present invention, the method of removing the conductive layer at the bottoms of the openings over the first region includes the following steps. First, a mask layer is formed over the substrate, wherein the mask layer covers the conductive layer between the openings over the first region, and exposes the conductive layer at the bottoms of the openings over the first region and a part of the conductive layer over the CMOS region. Next, the conductive layer at the bottoms of the openings over the first region and the part of the conductively layer on the CMOS region are removed while using the mask layer as a mask. Finally, the mask layer is removed.

According to an embodiment of the present invention, the second region includes a CMOS region, and the conductive layer extends to the CMOS region, wherein after the step of removing the conductive layer at the bottoms of the openings over the first region, the conductive layer on the CMOS region is further patterned.

According to an embodiment of the present invention, the method of removing the conductive layer at the bottoms of the openings over the first region includes the following steps. First, a mask layer is formed over the substrate, wherein the mask layer covers the CMOS region and exposes the conductive layer on the first region. Next, the conductive layer at the bottoms of the openings over the first region is removed while using the mask layer as a mask. Finally, the mask layer is removed.

According to an embodiment of the present invention, the method of removing the conductive layer at the bottoms of the openings over the first region includes etch-back process.

According to an embodiment of the present invention, the method of removing the conductive layer at the bottoms of the openings over the first region includes following steps. First, a mask layer is formed over the substrate, wherein the mask layer covers the conductive layer on the CMOS region and the conductive layer between the openings over the first region, and exposes the conductive layer at the bottoms of the openings over the first region. Next, the conductive layer at the bottoms of the openings over the first region is removed while using the mask layer as a mask. Finally, the mask layer is removed.

According to an embodiment of the present invention, the method of patterning the conductive layer on the CMOS includes the following steps. First, a mask layer is formed over the substrate, wherein the mask layer covers the first region and exposes a part of the conductive layer on the CMOS region. Next, the part of the conductive layer on the CMOS region is removed while using the mask layer as a mask. Finally, the mask layer is removed.

The present invention provides another semiconductor device including a first electrode and a conductive layer. The first electrode is disposed over a first region of a substrate. The conductive layer is disposed over the substrate and includes a second electrode. The second electrode is disposed above the first electrode and includes a mesh main part including a plurality of openings over the first region, and a plurality of extending parts, wherein the extending parts are connected to the mesh main part at periphery of the openings and extend toward a surface of the first electrode.

According to an embodiment of the present invention, a profile of the second electrode includes a plurality of dentations.

According to an embodiment of the present invention, the mesh main part has a concave region disposed on the extending parts.

According to an embodiment of the present invention, the substrate further includes a CMOS region, and the conductive layer further extends to the CMOS region.

According to an embodiment of the present invention, thickness of the mesh main part is approximately the same to that of the conductive layer on the CMOS region.

According to an embodiment of the present invention, thickness of the mesh main part is approximately less than that of the conductive layer on the CMOS region.

In the present invention, a plurality of the openings is formed in the dielectric layer, the conductive layer is formed on the dielectric layer and formed in the openings, and the conductive layer at the bottoms of the openings is removed to form the second electrodes having the mesh main part, and the dielectric layer between the second electrode and the first electrode is removed to form the MEMS device such as an MEMS microphone, etc. Moreover, the method of fabricating the semiconductor device may be combined to the CMOS process, so that fabrication process can be simplified and production yield can be improved.

In order to make the aforementioned and other objects, features and advantages of the present invention comprehensible, a preferred embodiment accompanied with figures is described in detail below.

These and other objectives of the present invention will no doubt become obvious to those of ordinary skill in the art after reading the following detailed description of the preferred embodiment that is illustrated in the various figures and drawings.

DETAILED DESCRIPTION

FIG. 1A to FIG. 1G are cross-sectional diagrams illustrating a method for fabricating a semiconductor device according to a first embodiment of the present invention.

Figure 1A:
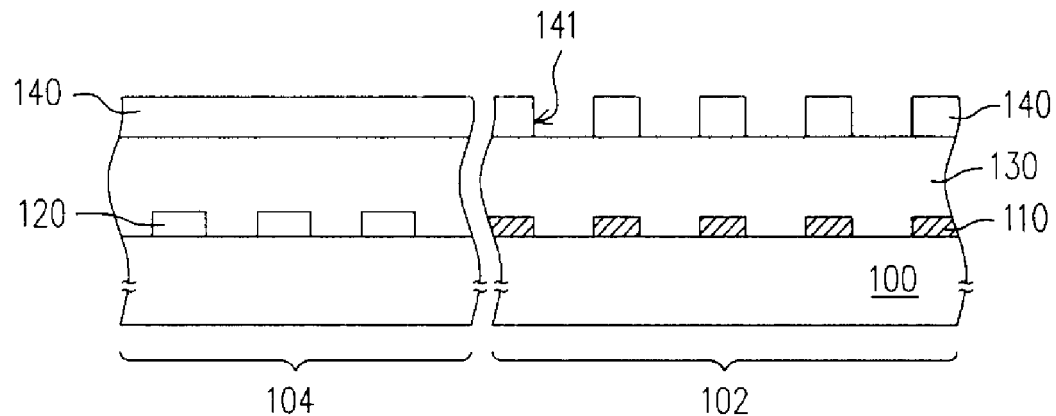
FIG. 1A to FIG. 1G are cross-sectional diagrams illustrating a method for fabricating a semiconductor device according to a first embodiment of the present invention.

Referring to FIG. 1A, in the present embodiment, a substrate 100 includes a first region 102 and a second region 104. The first region 102 may be an MEMS device region, and the second region 104 may be a CMOS region. First, a first electrode 110 and a gate 120 are respectively formed on the first region 102 and the second region 104. The first electrode 110 may be a mesh electrode, a strip electrode or a flake electrode, and the material thereof may be conductive material such as polysilicon, polycide, aluminium, tungsten or titanium, etc.

Next, a dielectric layer 130 is formed on the substrate 100 for covering the first electrode 110 and the gate 120. The material of the dielectric layer 130 may be a dielectric material such as silicon oxide, un-doped silicon glass (USG), borophosphosilicate glass (BPSG) or phosphosilicate glass (PSG), etc. Next, a mask layer 140 is formed on the dielectric layer 130. In the present embodiment, the mask layer 140 on the first region 102 has a plurality of openings 141 to expose a part of the dielectric layer 130. The mask layer 140 on the second region 104 totally covers the dielectric layer 130. The material of the mask layer 140 may be photoresist.

Figure 1B:
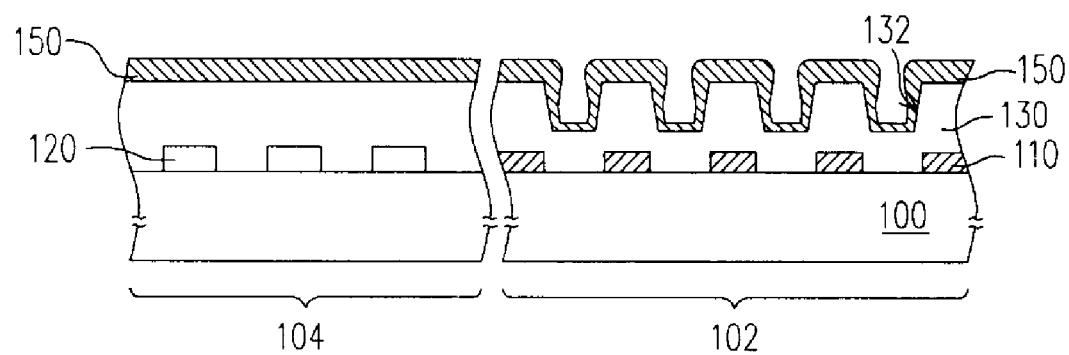

Next, referring to FIG. 1B, the dielectric layer 130 exposed by the openings 141 is removed while using the mask layer 140 as a mask, so as to form a plurality of openings 132 in the dielectric layer 130 of the first region 102. In the present embodiment, the openings 132 and the first electrodes 110 are interlaced, though the present invention is not limited thereto. In other words, in the other embodiments, the openings 132 may be disposed partially overlapped or totally overlapped to the first electrodes 110. Next, the mask layer 140 is removed. Next, a conductive layer 150 is formed on the dielectric layer 130 to cover the first region 102 and the second region 104. The material of the conductive layer 150 may be the same or different to that of the first electrode 110, which may be the conductive material such as polysilicon, polycide, aluminium, tungsten or titanium, etc. Method of forming the conductive layer 150 includes chemical vapor deposition or sputtering deposition, etc.

Figure 1C:
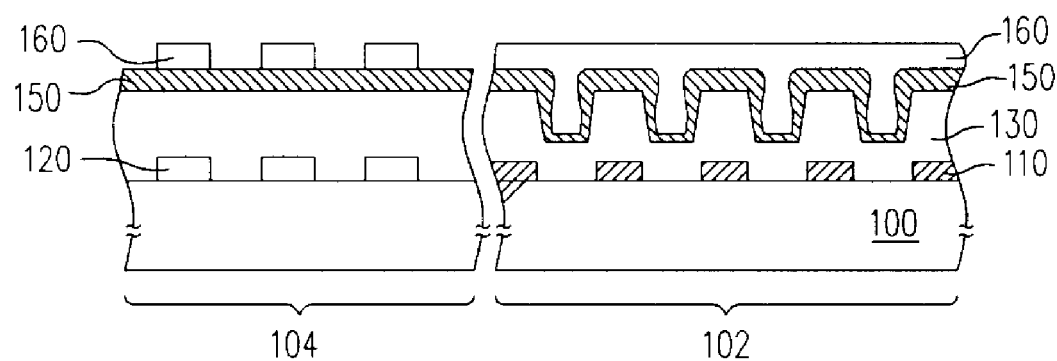

Next, referring to FIG. 1C, a mask layer 160 is formed on the substrate 100. The mask layer 160 on the first region 102 totally covers the conductive layer 150, and the mask layer 160 on the second region 104 has line patterns to be formed. Material of the mask layer 160 may be photoresist.

Figure 1D:
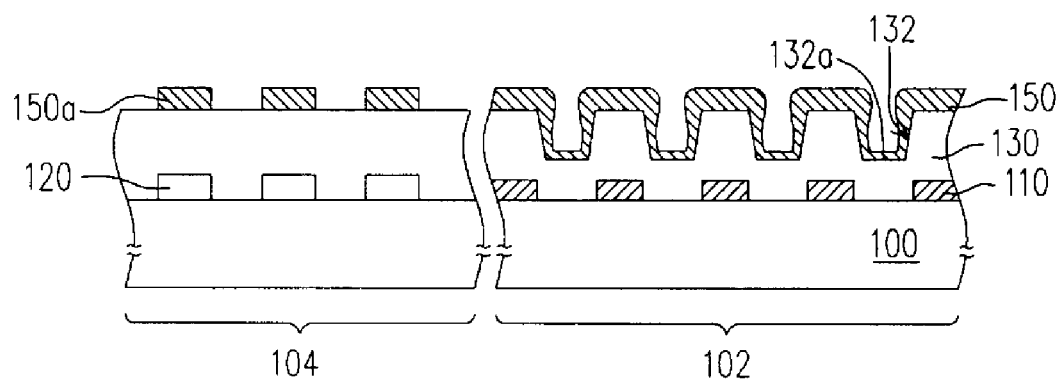

Next, referring to FIG. 1D, a part of the conductive layer 150 on the second region 104 is removed while using the mask layer 160 as a mask, so as to transfer the line patterns of the mask layer 160 to form a patterned conductive layer 150a. Next, the mask layer 160 is removed.

Figure 1E:
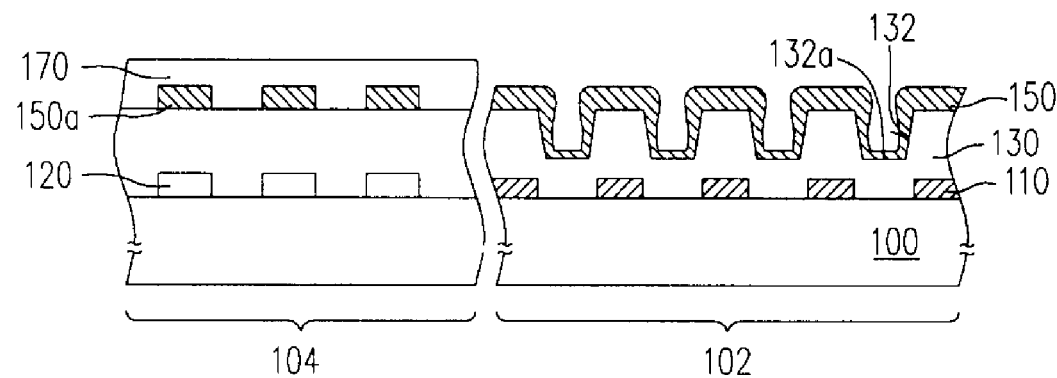

Next, referring to FIG. 1E, a mask layer 170 is formed on the substrate 100 to cover the second region 104 and expose the conductive layer 150 on the first region 102. Material of the mask layer 170 may be photoresist.

Figure 1F:
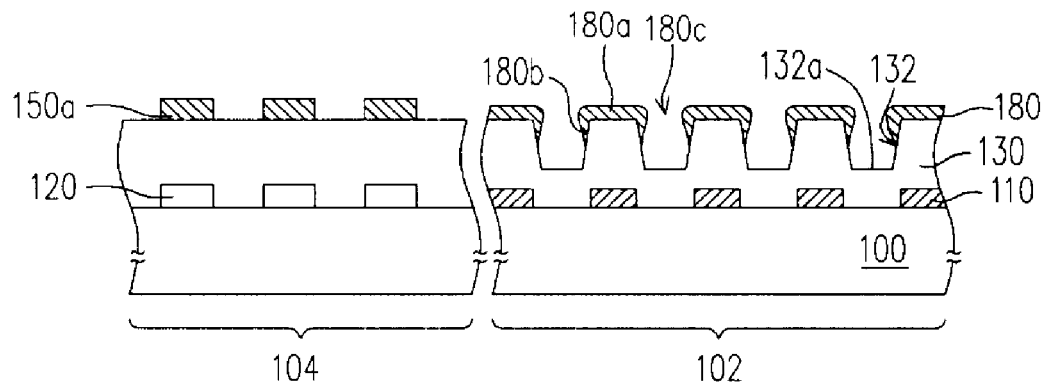

Next, referring to FIG. 1E and FIG. 1F, the conductive layer 150 is etched by a blanket etch-back process while using the mask layer 170 as a mask, so as to remove the conductive layer 150 at bottoms 132a of the openings 132 to form second electrodes 180. Next, the mask layer 170 is removed.

Figure 1G:
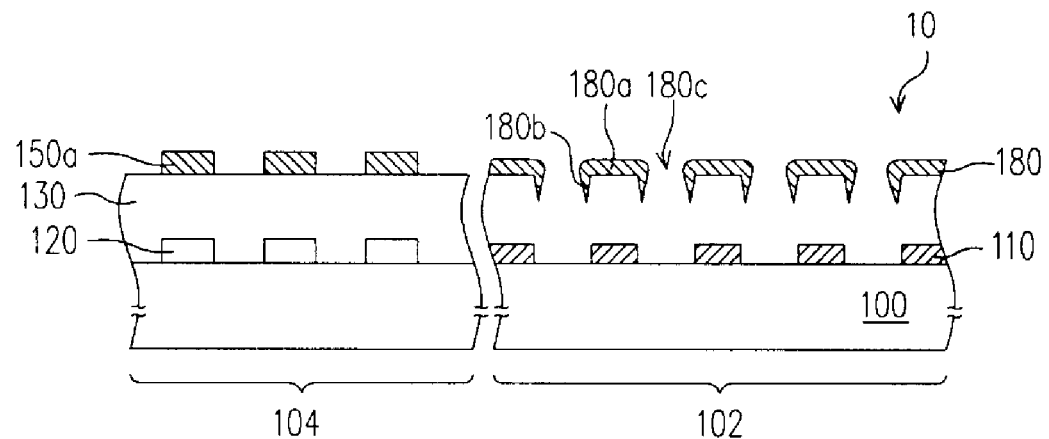

Referring to FIG. 1G, the dielectric layer 130 between the second electrodes 180 and the first electrodes 110 is removed to form the semiconductor device 10. The method of removing the dielectric layer 130 includes an isotropic etching process, for example, a wet etching process.

Figure 2:
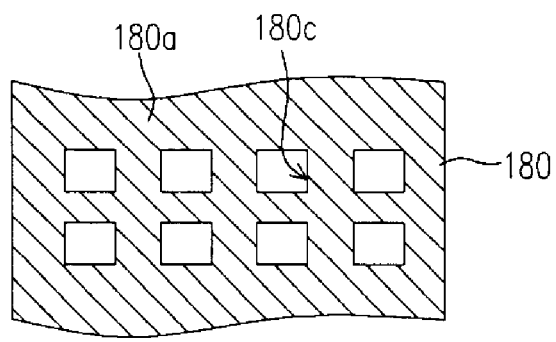
FIG. 2 is a top view of a part of second electrodes according to the first embodiment of the present invention.

FIG. 2 is a top view of a part of second electrodes according to the first embodiment of the present invention.

Referring to FIG. 1G and FIG. 2, the second electrode 180 formed in the present embodiment includes a mesh main part 180a having a plurality of openings 180c, and a plurality of extending parts 180b. The extending parts 180b are connected to the mesh main part 180a at peripheries of the openings 180c and extend toward a surface of the first electrodes 110. Therefore, the second electrode 180 has an approximate mesh structure, and a profile thereof includes a plurality of discontinuous dentations. The mesh main part 180a forms a tooth crown, and the extending part 180b forms a tooth root. Moreover, in the present embodiment, since during fabrication of the second electrodes 180, the second region 104 is covered by the mask layer 170, and the conductive layer 150 at the bottoms 132a of the openings 132 of the dielectric layer 130 on the first region 102 is removed by the blanket etch-back process, the thickness of the mesh main part 180a of the second electrode 180 on the first region 102 is then less than the thickness of the patterned conductive layer 150a on the second region 104.

Referring to FIG. 1G, after the dielectric layer 130 between the second electrode 180 and the first electrode 110 is removed, a part of the second electrode 180 may be hanged above the first electrodes 110, so that the second electrode 180 with the approximate mesh structure is vulnerable to be disturbed by an external signal (the external signal may be transmitted via a hole (not shown) on the substrate 100), and therefore the second electrode 180 may be vibrated in response to the disturbance, and accordingly a capacitance between the first electrode and the second electrode is varied. In other words, the semiconductor device 10 may transform the external signal into an electric signal. For example, if the semiconductor device 10 is an MEMS microphone, the second electrode 180 is vibrated in response to the disturbance of a sound wave, so that the semiconductor device 10 transforms the sound wave into the electric signal. Certainly, in other embodiments, the semiconductor device may also be a tiny MEMS device such as an accelerometer, a switch, a capacitor or a sensor, etc.

Figure 3A:
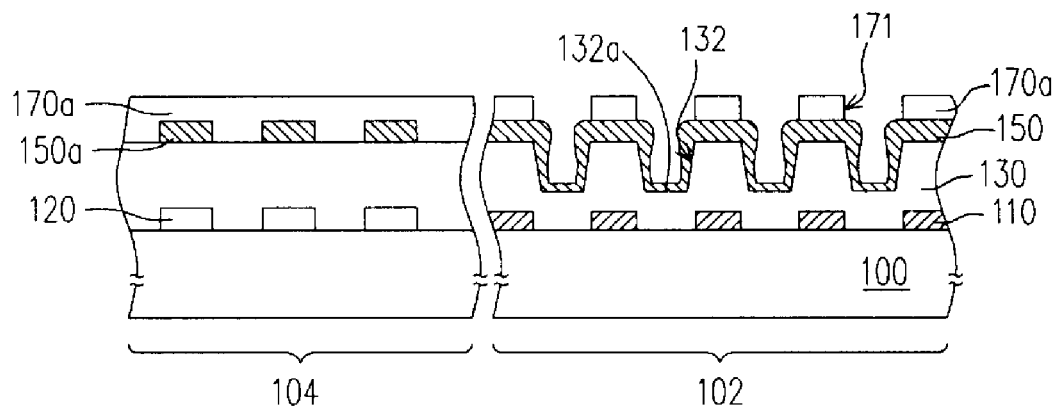
FIG. 3A to FIG. 3C are cross-sectional diagrams illustrating a method for fabricating a semiconductor device according to a second embodiment of the present invention.
Figure 3B:
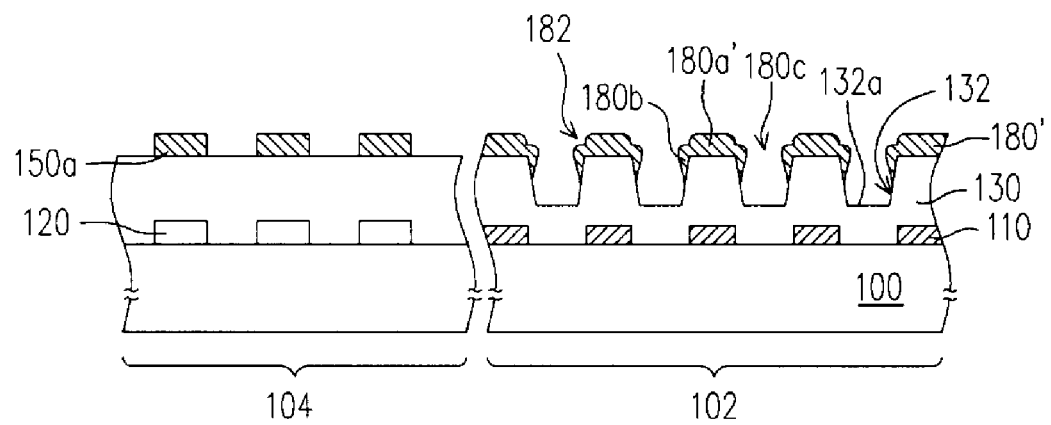
Figure 3C:
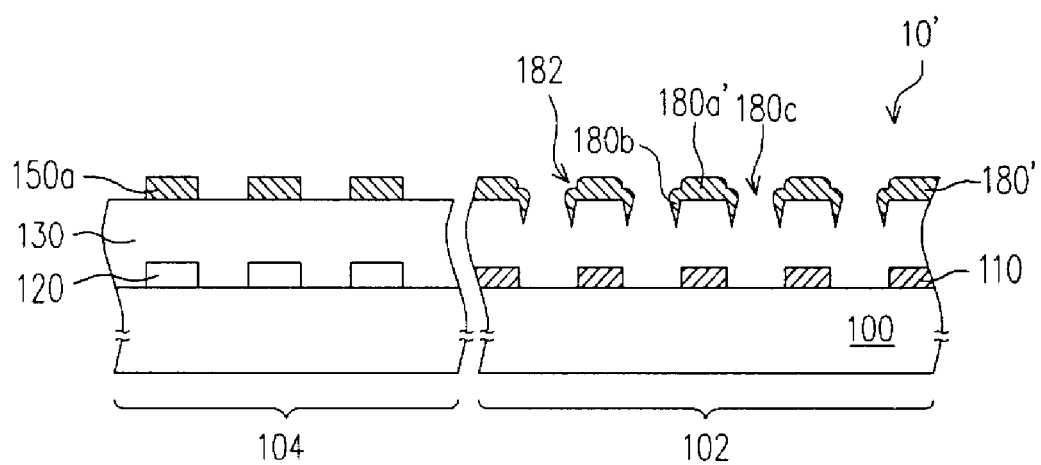

FIG. 3A to FIG. 3C are cross-sectional diagrams illustrating a method for fabricating a semiconductor device according to a second embodiment of the present invention. In the present embodiment, another method for removing the conductive layer 150 at the bottoms 132a of the openings 132 is provided. The prior fabrication processes of the semiconductor device are similar to that of the first embodiment shown in FIG. 1A to FIG. 1D, and therefore detailed description thereof may be referred to the above descriptions of FIG. 1A to FIG. 1D, and will not be repeated.

Referring to FIG. 3A, after the patterned conductive layer 150a is formed, a mask layer 170a is first formed on the substrate 100. The mask layer 170a on the first region 102 has a plurality of openings 171 to expose the conductive layer 150 at the bottoms 132a of the openings 132. The material of the mask layer 170a may be photoresist.

Next, referring to FIG. 3B, the conductive layer 150 at the bottoms 132a of the openings 132 is removed while using the mask layer 170a as a mask, so that the conductive layer remained on the first region 102 may form second electrodes 180'. The method of removing the conductive layer 150 at the bottoms 132a of the openings 132 includes an anisotropic etching process, for example, a dry etching process. Thereafter, the second mask layer 170a is removed.

Afterwards, referring to FIG. 3C, the dielectric layer 130 between the second electrodes 180' and the first electrodes 110 is removed to form a semiconductor device 10'. The method of removing the dielectric layer 130 includes the isotropic etching process, for example, the wet etching process.

In the present embodiment, the second electrode 180' includes a mesh main part 180a' having a plurality of the openings 180c, and a plurality of the extending parts 180b, wherein the extending parts 180b are connected to the mesh main part 180a' at peripheries of the openings 180c and extend toward a surface of the first electrodes 110. During removal of the conductive layer 150 at the bottoms 132a of the openings 132, due to size difference or shifting of the mask layer 170a, the mesh main part 180a' may include a concave region 182 disposed on the extending part 180b. Therefore, a profile of the second electrode 180' is a plurality of dentations with missing angles. The mesh main part 180a' forms the tooth crown, and the extending part 180b forms the tooth root. Moreover, since the mask layer 170a covers the conductive layer 150 between the openings 132, during the etching process, the conductive layer 150 between the openings 132 is not etched. Therefore, the thickness of the mesh main part 180a' of the second electrode 180' is approximately the same to that of the patterned conductive layer 150a on the second region 104. Moreover, the semiconductor device 10' is similar to the semiconductor device 10 of the first embodiment, and therefore detailed description thereof will not be repeated.

Figure 4A:
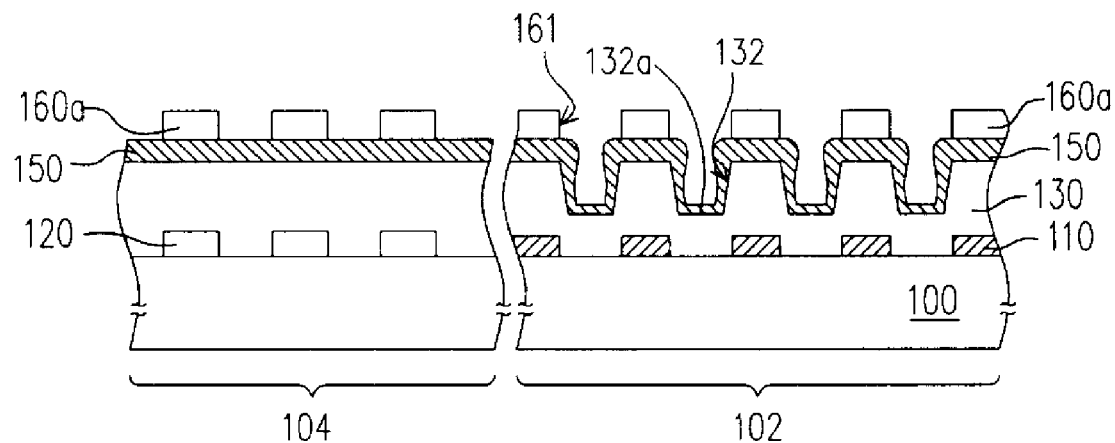
FIG. 4A and FIG. 4B are cross-sectional diagrams illustrating a method for fabricating a semiconductor device according to a third embodiment of the present invention.
Figure 4B:
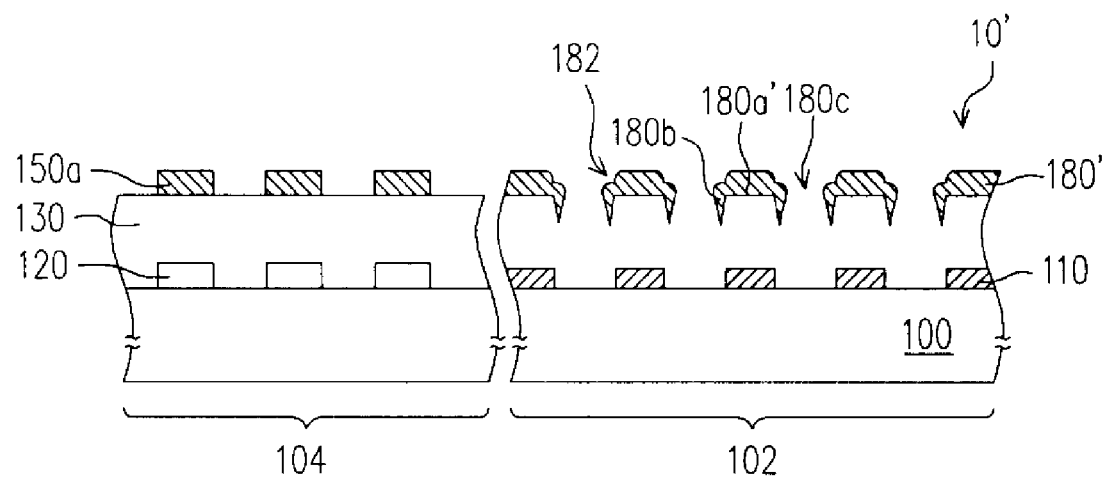

FIG. 4A and FIG. 4B are cross-sectional diagrams illustrating a method for fabricating a semiconductor device according to a third embodiment of the present invention. In the present embodiment, a method of simultaneously forming the patterned conductive layer and the second electrodes is provided. The prior fabrication processes of the semiconductor device are similar to that of the first embodiment shown in FIG. 1A and FIG. 1B, and therefore detailed description thereof may be referred to the above descriptions of FIG. 1A and FIG. 1B, and will not be repeated.

Referring to FIG. 4A, after the conductive layer 150 is formed on the dielectric layer 130, a mask layer 160a is first formed on the conductive layer 150. In the present embodiment, the mask layer 160a on the first region 102 has a plurality of openings 161 to expose the conductive layer 150 at the bottoms 132a of the openings 132. The mask layer 160a on the second region 104 has line patterns to be formed. The material of the mask layer 160a may be photoresist.

Next, referring to FIG. 4B, the conductive layer 150 at the bottoms 132a of the openings 132 and a part of the conductive layer 150 exposed by the mask layer 160a on the second region 104 are removed while using the mask layer 160a as a mask, so as to simultaneously form the second electrodes 180' on the first region 102 and the patterned conductive layer 150a on the second region 104. The method of removing the conductive layer 150 includes the anisotropic etching process, for example, the dry etching process. Thereafter, the mask layer 160a is removed. Afterwards, the dielectric layer 130 between the second electrodes 180' and the first electrodes 110 is removed to form the semiconductor device 10'. The method of removing the dielectric layer 130 includes the isotropic etching process, for example, the wet etching process.

In the present embodiment, structures of the second electrode 180' and the semiconductor device 10' are similar to that of the second electrode 180' and the semiconductor device 10' of the second embodiment, and thereof detailed description thereof will not be repeated. However, in the present embodiment, since the second electrodes 180' and the patterned conductive layer 150a are simultaneously formed in a same fabrication process, fabrication steps thereof is then simplified, and therefore production cost can be greatly reduced and production yield can be improved.

In the aforementioned embodiments, the patterned conductive layers are formed first, and then the second electrodes are formed, or the patterned conductive layers and the second electrodes are formed simultaneously. However, in other embodiments, the second electrodes may also be formed first, and then the patterned conductive layer is formed.

FIG. 5A to FIG. 5D are cross-sectional diagrams illustrating a method for fabricating a semiconductor device according to a fourth embodiment of the present invention.

Figure 5A:
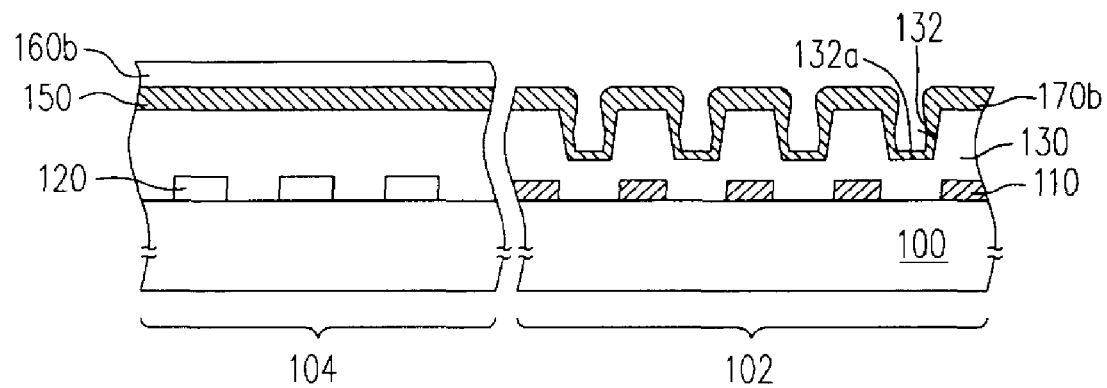
FIG. 5A to FIG. 5D are cross-sectional diagrams illustrating a method for fabricating a semiconductor device according to a fourth embodiment of the present invention.

Referring to FIG. 5A, the dielectric layer 130 with the openings 132 and the conductive layer 150 have been formed on the substrate 100 as mentioned in the first embodiment. A mask layer 160b is formed on the substrate 100 to cover the second region 104 and to expose the conductive layer 150 over the first region 102. Material of the mask layer 160b may be photoresist.

Figure 5B:
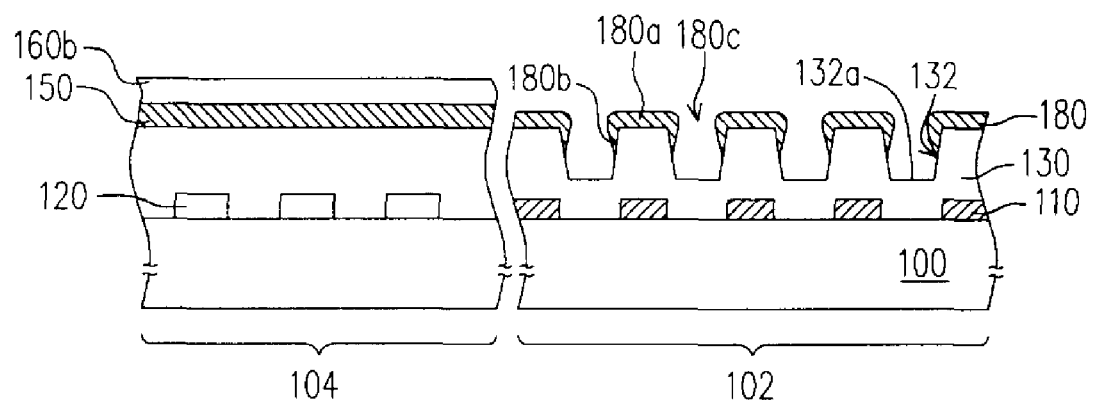

Next, referring to FIG. 5B, the conductive layer 150 is etched by a blanket etch-back process while using the mask layer 160b as a mask, so as to remove the conductive layer 150 at bottoms 132a of the openings 132 to form second electrodes 180.

Figure 5C:
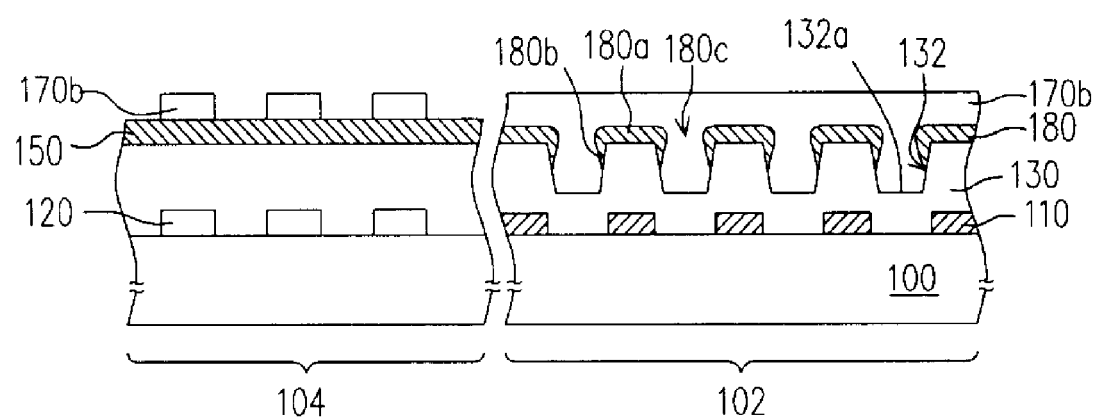

Next, referring to FIG. 5C, the mask layer 160b is removed. After that, a mask layer 170b is formed on the substrate 100. The mask layer 170b on the first region 102 totally covers the second electrode 180, and the mask layer 170b on the second region 104 has line patterns to be formed. Material of the mask layer 170b may be photoresist.

Figure 5D:
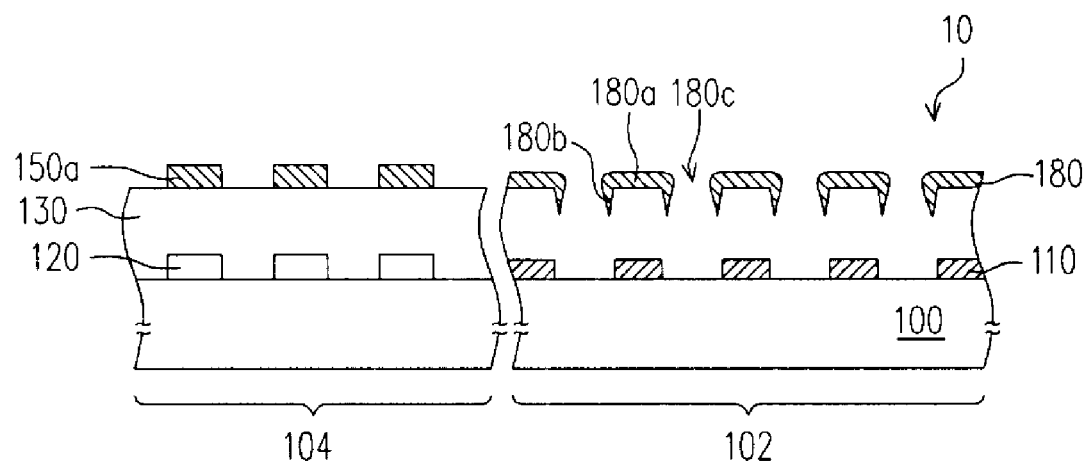

Next, referring to FIG. 5D, a part of the conductive layer 150 on the second region 104 is removed while using the mask layer 170b as a mask, so as to transfer the line patterns of the mask layer 170b to form a patterned conductive layer 150a. Next, the mask layer 170b is removed. Thereafter, the dielectric layer 130 between the second electrodes 180 and the first electrodes 110 is removed to form the semiconductor device 10. The method of removing the dielectric layer 130 includes an isotropic etching process, for example, a wet etching process. In the present embodiment, structures of the second electrode 180 and the semiconductor device 10 are similar to those structures described in the first embodiment, and thereof detailed description thereof will not be repeated.

FIG. 6A to FIG. 6D are cross-sectional diagrams illustrating a method for fabricating a semiconductor device according to a fifth embodiment of the present invention.

Figure 6A:
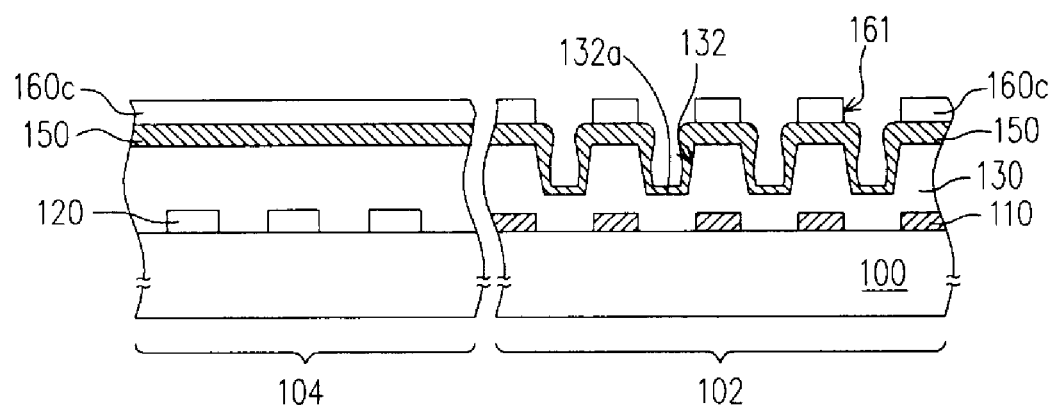
FIG. 6A to FIG. 6D are cross-sectional diagrams illustrating a method for fabricating a semiconductor device according to a fifth embodiment of the present invention.

Referring to FIG. 6A, the dielectric layer 130 with the openings 132 and the conductive layer 150 have been formed on the substrate 100 as mentioned in the first embodiment. A mask layer 160c is first formed on the substrate 100. The mask layer 160c on the first region 102 has a plurality of openings 161 to expose the conductive layer 150 at the bottoms 132a of the openings 132, and the mask layer 160c on the second region 104 totally covers the conductive layer 150. The material of the mask layer 160c may be photoresist.

Figure 6B:
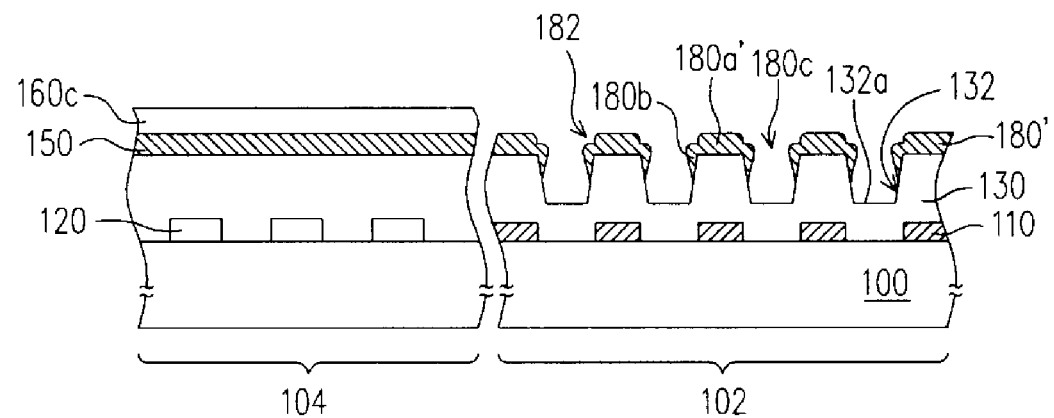

Next, referring to FIG. 6B, the conductive layer 150 at the bottoms 132a of the openings 132 is removed while using the mask layer 160c as a mask, so that the conductive layer remained on the first region 102 may form second electrodes 180'. The method of removing the conductive layer 150 at the bottoms 132a of the openings 132 includes an anisotropic etching process, for example, a dry etching process.

Figure 6C:
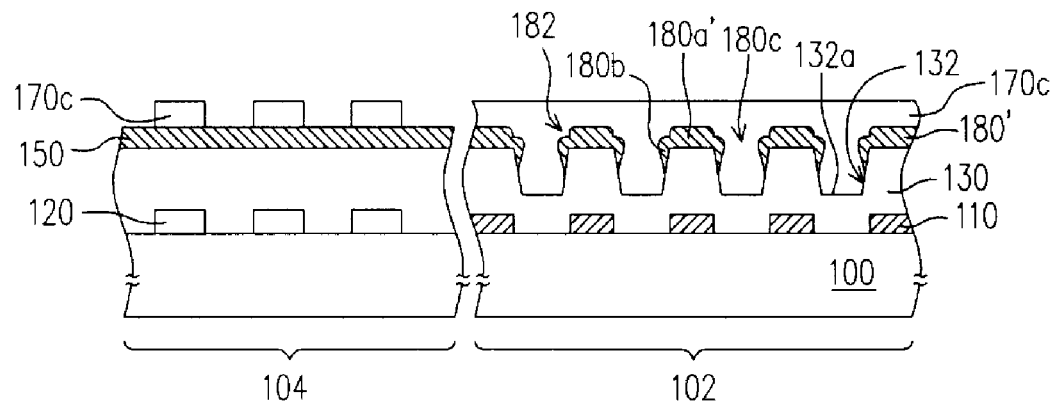

Next, referring to FIG. 6C, the second mask layer 160c is removed. Thereafter, a mask layer 170c is formed on the substrate 100. The mask layer 170c on the first region 102 totally covers the second electrode 180', and the mask layer 170c on the second region 104 has line patterns to be formed. Material of the mask layer 170c may be photoresist.

Figure 6D:
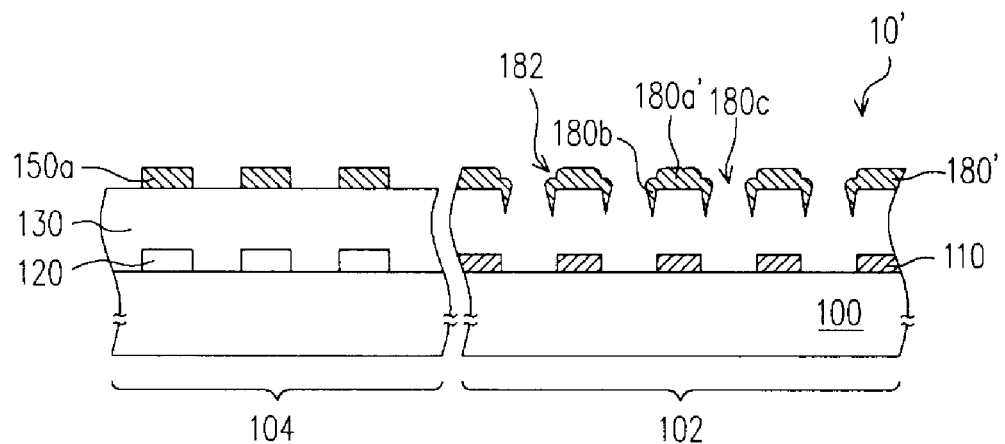

Next, referring to FIG. 6D, a part of the conductive layer 150 on the second region 104 is removed while using the mask layer 170c as a mask, so as to transfer the line patterns of the mask layer 170c to form a patterned conductive layer 150a. Next, the mask layer 170c is removed. Thereafter, the dielectric layer 130 between the second electrodes 180' and the first electrodes 110 is removed to form the semiconductor device 10'. The method of removing the dielectric layer 130 includes an isotropic etching process, for example, a wet etching process. In the present embodiment, structures of the second electrode 180' and the semiconductor device 10' are similar to those described in the second embodiment, and thereof detailed description thereof will not be repeated.

According to the embodiments mentioned above, the order of patterning the conductive layer above the second region and removing the conductive layer at the bottom of the openings may be exchanged in the present invention. In other words, it will be apparent to those skilled in the art that the steps mentioned above can be adjusted with the requirements of the processes.

In summary, the second electrode with the approximate mesh structure and with dentations profile may be formed according to the present invention, and may be applied to the semiconductor device such as the MEMS microphone, etc. Moreover, the method of fabricating the semiconductor device is compatible to the present CMOS process, so that fabrication cost will be controlled effectively. Furthermore, the method of fabricating the semiconductor device may be combined to the present CMOS process, so that fabrication process can be simplified and throughput can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a first electrode, disposed over a first region of a substrate; and
    a conductive layer, disposed over the substrate, including a second electrode disposed above the first electrode, wherein the second electrode comprises a mesh main part having a plurality of openings, and a plurality of extending parts, wherein the extending parts are connected to the mesh main part at periphery of the openings and extend toward a surface of the first electrode.

2. The semiconductor device as claimed in claim 1, wherein a profile of the second electrode comprises a plurality of dentations.

3. The semiconductor device as claimed in claim 1, wherein the mesh main part has a concave region disposed on the extending part.

4. The semiconductor device as claimed in claim 1, wherein the substrate further comprises a CMOS region, and the conductive layer further extends to the CMOS region.

5. The semiconductor device as claimed in claim 4, wherein thickness of the mesh main part is substantially the same to that of the conductive layer on the CMOS region.

6. The semiconductor device as claimed in claim 4, wherein thickness of the mesh main part is substantially less than that of the conductive layer on the CMOS region.

* * * * *